(12) United States Patent
Wang (10) Patent No.: US 11,014,828 B2
(45) Date of Patent: May 25, 2021

(54) INFLATABLE NON-IMAGING SOLAR CONCENTRATOR BASED CONCENTRATING HYBRID SOLAR THERMAL AND PHOTOVOLTAIC SYSTEM POWERED WATER DESALINATION SYSTEM

(71) Applicant: Yonghua Wang, Klamath Falls, OR (US)

(72) Inventor: Yonghua Wang, Klamath Falls, OR (US)

(73) Assignee: Yonghua Wong, Klamath Falls, OR (US)

( * ) Notice: Subject to any disclaimer, the term of this patent is extended or adjusted under 35 U.S.C. 154(b) by 0 days.

(21) Appl. No.: 16/602,230

(22) Filed: Aug. 30, 2019

(65) Prior Publication Data
US 2021/0061678 A1  Mar. 4, 2021

(51) Int. Cl.
| | |
|---|---|
| *C02F 1/14* | (2006.01) |
| *F24S 20/80* | (2018.01) |
| *H01L 31/054* | (2014.01) |
| *B01D 1/00* | (2006.01) |

(52) U.S. Cl.
CPC .............. *C02F 1/14* (2013.01); *B01D 1/0005* (2013.01); *B01D 1/0035* (2013.01); *F24S 20/80* (2018.05); *H01L 31/0547* (2014.12); *Y02E 10/40* (2013.01); *Y02E 10/52* (2013.01)

(58) Field of Classification Search
CPC ....... B01D 1/0005; B01D 1/0035; C02F 1/14; Y02E 10/40; Y02E 10/42; Y02E 10/44; Y02E 10/45; Y02E 10/46; Y02E 10/50; Y02E 10/52; H01L 31/0547; F24S 20/80
See application file for complete search history.

(56) References Cited

U.S. PATENT DOCUMENTS

| | | | |
|---|---|---|---|
| 7,612,735 B2 * | 11/2009 | Essig, Jr. ............... | B01D 61/06 343/915 |
| 10,207,935 B2 * | 2/2019 | Beitelmal ................. | C02F 1/14 |
| 10,358,359 B2 * | 7/2019 | Gershon .............. | B01D 61/025 |
| 2006/0033674 A1 * | 2/2006 | Essig, Jr. ................ | F24S 20/80 343/912 |

(Continued)

*Primary Examiner* — Jonathan Miller (57) ABSTRACT

An inflatable non-imaging solar concentrator based concentrating solar thermal and photovoltaic system powered water desalination system comprises a concentrating electricity and heat cogeneration subsystem, a battery storage subsystem, a thermal storage subsystem with electric heater, a thermal power regeneration subsystem, and a water distillation system with electric heater. The inflatable non-imaging solar concentrator makes the concentrating system substantially low cost, and the hybrid solar thermal and photovoltaic panels used to construct the cogeneration receiver make the system ultra-high efficient. The cogenerated thermal energy is stored in a thermal storage and the cogenerated electric energy is stored in a battery storage to heat the stored thermal energy to pre-set high temperature for thermal power regeneration. The thermal energy after thermal power generation is used to desalinize water with assistance of electric heater powered by the stored electricity. An extra conventional photovoltaic system is added to compensate the concentrating hybrid solar thermal and photovoltaic system.

3 Claims, 6 Drawing Sheets

(56) References Cited

U.S. PATENT DOCUMENTS

| | | | |
|---|---|---|---|
| 2012/0180849 A1* | 7/2012 | Bettencourt | F24S 20/20 |
| | | | 136/248 |
| 2013/0168224 A1* | 7/2013 | Godshall | C02F 1/14 |
| | | | 203/10 |
| 2015/0143806 A1* | 5/2015 | Friesth | F28D 20/0039 |
| | | | 60/517 |
| 2016/0194217 A1* | 7/2016 | Al-Ghizzy | B01D 3/101 |
| | | | 203/10 |
| 2017/0204838 A1* | 7/2017 | Correia | H02S 40/44 |

* cited by examiner

INFLATABLE NON-IMAGING SOLAR CONCENTRATOR BASED CONCENTRATING HYBRID SOLAR THERMAL AND PHOTOVOLTAIC SYSTEM POWERED WATER DESALINATION SYSTEM

TECHNICAL FIELD

The present disclosure relates generally to water desalination system, more specifically to inflatable non-imaging solar concentrator based concentrating hybrid solar thermal and photovoltaic system powered water desalination system.

BACKGROUND

Water use and handling technologies are an essential part of world infrastructure, and which is increasingly being stressed due to age, population growth, competing energy demands, and increasing disruption of natural hydrologic cycles leading to regional water scarcity. Desalination is increasingly being considered as an important potential solution to increase water supplies for municipal water and agriculture, and is an essential technology to purify water produced from various industrial processes, as well as from oil and gas exploration. Each market presents different possible avenues to integrate solar thermal energy into the process as the primary energy resource. Most municipal desalination in the U.S. utilizes reverse osmosis (RO), which is performed at ambient temperatures with no special heating of the feed stream. However, low-cost solar thermal energy can potentially make thermal desalination a low cost option, while reducing demand for electricity, the primary energy input into RO processes. Agriculture has high water demands with runoff that is typically saline due to salts in the soil and groundwater occurring naturally high salt content and is often generated away from grid infrastructure. Thermal desalination, in general, has particular application for water with high total dissolved salt (TDS) content or for applications that require zero liquid discharge (ZLD), which RO cannot typically address.

One of the solar desalinations is called solar distillation (John A. Duffie and William A. Beckman, Solar Engineering of Thermal Processes, $4^{th}$ Edition, PP640-647). This still utilizes a shallow black basin to hold the salt water and absorb solar radiation; water vaporize from the brine, condense on the underside of a sloped transparent cover, run into troughs, and is collected in tanks at the end of the still. The advantage of the still is that the incident solar radiation is directly absorbed to evaporate the water. The drawback of this still is that the vapor condensed on the transparent cover reduces the transparency of the cover, and consequently, reduces the efficiency of the still. The other drawbacks of the still are that the basin occupies large area of land and the large area bottom of the basin needs to be insulated.

Another solar desalination is concentrating solar distillation. In this still, the concentrating solar thermal technologies are used to convert the solar flux into heat, and then transfer the heat to a heat exchanger to evaporate the water from brine. Although this approach overcomes the drawbacks of the shallow black basin based green-house type still described above, the conventional collecting elements the system concentrators are costly. In addition, the pure thermal system is not efficient in distilling the sea water. For instance, when the multi-effect distillation system is employed to distill the sea water, electric auxiliary heating system and energy storage system are desirable for continuity.

The goal of this application is to provide a design paradigm of concentrating solar thermal and photovoltaic desalination system that directly concentrates solar flux and cogenerates electricity and thermal energy, and then the thermal energy is directly used to heat the sea water to certain temperature. Then the electric energy is used to heat the pre-heated sea water to boiling point in a distiller. In order to dramatically reduce the cost of concentrating system, the applicant's newest innovation "Inflatable Non-imaging Solar Concentrator" (INISC) will be used to concentrate the solar flux to a hybrid solar thermal and photovoltaic receiver. The INISC with a close structure made of thin and light materials is not only able to extraordinarily reduce the cost of the concentrator itself, but also able to avoid any support and fasten parts with a gas expanded membrane apparatus. The INISC can concentrate not only beam light, but also diffuse light with high concentration ratio up to more than 100 suns.

The desalination system disclosed in this application is formed by placing the INISC into a hybrid solar thermal and photovoltaic receiver to cogenerate heat and electricity, the heat will be transferred to a thermal storage with electric heater, and the electricity will be stored in a battery system. In the thermal storage, the pre-heated sea water is further heated up to a pre-set high temperature for thermal power generation with the electric heater. Then a thermal power generation system is integrated into the system to regenerate power by taking the stored thermal energy in the thermal storage. After the thermal power generation, the residue thermal energy is transferred into a distiller with electric heater powered by the electricity stored in the battery system to generate fresh water.

Another embodiment of the desalination system disclosed in this application is formed by coupling the INISC into a solar thermal receiver containing water for desalination. The incident sunlight is directly concentrated into the water for preheating. An extra photovoltaic system is added to generate electric power and the electric power will be stored in a battery system. Then the pre-heated sea water is transferred into a thermal storage with an electric heater. In the thermal storage, the pre-heated sea water is further heated up to a pre-set high temperature for thermal power generation with the electric heater. A thermal power generation system is integrated into the system to regenerate power by taking the stored thermal energy in the thermal storage. After the thermal power generation, the residue thermal energy is transferred into a distiller with electric heater powered by the electricity stored in the battery system to generate fresh water.

OBJECTS AND ADVANTAGES

In this disclosure, the INISC, which is super-light, ultra-low cost, and extremely simple, is employed to directly concentrate the incident sunlight to the hybrid solar thermal and photovoltaic receiver to cogenerate electricity and heat. During this process, the heat cogenerated in the photovoltaic panel is extracted by using a circulation system to cool down the panel integrated onto the heat exchanger panel to dramatically raise the efficiency of the photovoltaic panel especially in hot climate. In order to keep the optimized temperature of the photovoltaic panel, the temperature of the heat extracted from the photovoltaic panel is not enough to efficiently power a thermal power generation system, so the electricity cogenerated in the photovoltaic panel is employed to heat the pre-heated sea water in an thermal storage. Then a thermal power generation system is employed to take the thermal energy stored in the thermal storage to regenerate power. After the thermal power generation, the residue thermal energy is transferred to a distiller to evaporate the sea water with the assistance of a electric heater and produce the fresh water. In order to balance the intermittence of the solar radiation, a battery storage system is integrated into the system for storing the electricity and enhancing the distillation process. The advantages of the configuration of the system is apparent: the INISC tremendously reduce the cost of the concentrating hybrid solar thermal and photovoltaic system; the solar thermal energy and electricity cogeneration receiver dramatically increase the total efficiency of the entire system to above 70%; the circulation system effectively improves the performance of the photovoltaic panels; a thermal storage is employed to store thermal energy for thermal power generation; a thermal power generation is employed to generate power before desalination; the residue thermal energy of the thermal power generation system is used to desalinize water, so the system cogenerate electric power and fresh water; the separate electric distiller effectively enhance the distillation process; and the battery storage system substantially increases the reliability and resilience of the entire system.

SUMMARY

In summary, this invention intends to provide 7 incentives to the solar powered water desalination system: (1) low cost, the presented system employs the newly invented Inflatable Non-imaging Solar Concentrator (INISC), which is extremely cheap in the sense that cheap thin materials and thin coating films are used to form a gas expanded structure without support parts, to construct a concentrating solar system to dramatically reduce the cost of solar powered water desalination system; (2) high efficiency, the presented system employs the newly developed ultra-high efficiency hybrid solar thermal and photovoltaic panels to construct the receiver of the concentrating solar system to extraordinarily raise the total efficiency of the concentrating system; (3) upgraded thermal energy for thermal power generation, the presented system uses the cogenerated electric power and the extra electric power from the extra photovoltaic system to raise the temperature of the stored thermal energy for high efficiency of the thermal power generation; (4) thermal storage, the presented system use thermal energy to realize stabilized power generation and fresh water generation; (5) cogeneration of power and fresh water, the presented system generate both power and fresh water simultaneously; (6) multiple effect water desalination, the presented system recycles the residue thermal energy after thermal power generation to produce fresh water by using multiple effect distillation with the assistance of the electric heater powered by the electricity from the battery storage; (7) smoothing the intermittence of the solar radiation, the presented system employs battery storage to smooth the intermittence of solar radiation.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate an embodiment of the invention and together with the description, serve to explain the principles of the invention.

DETAILED DESCRIPTION

Reference will now be made in detail to the present exemplary embodiment, example of which is illustrated in the accompanying drawings. Wherever possible, the same reference numbers will be used throughout the drawings to refer to the same or like parts.

Figure 1:
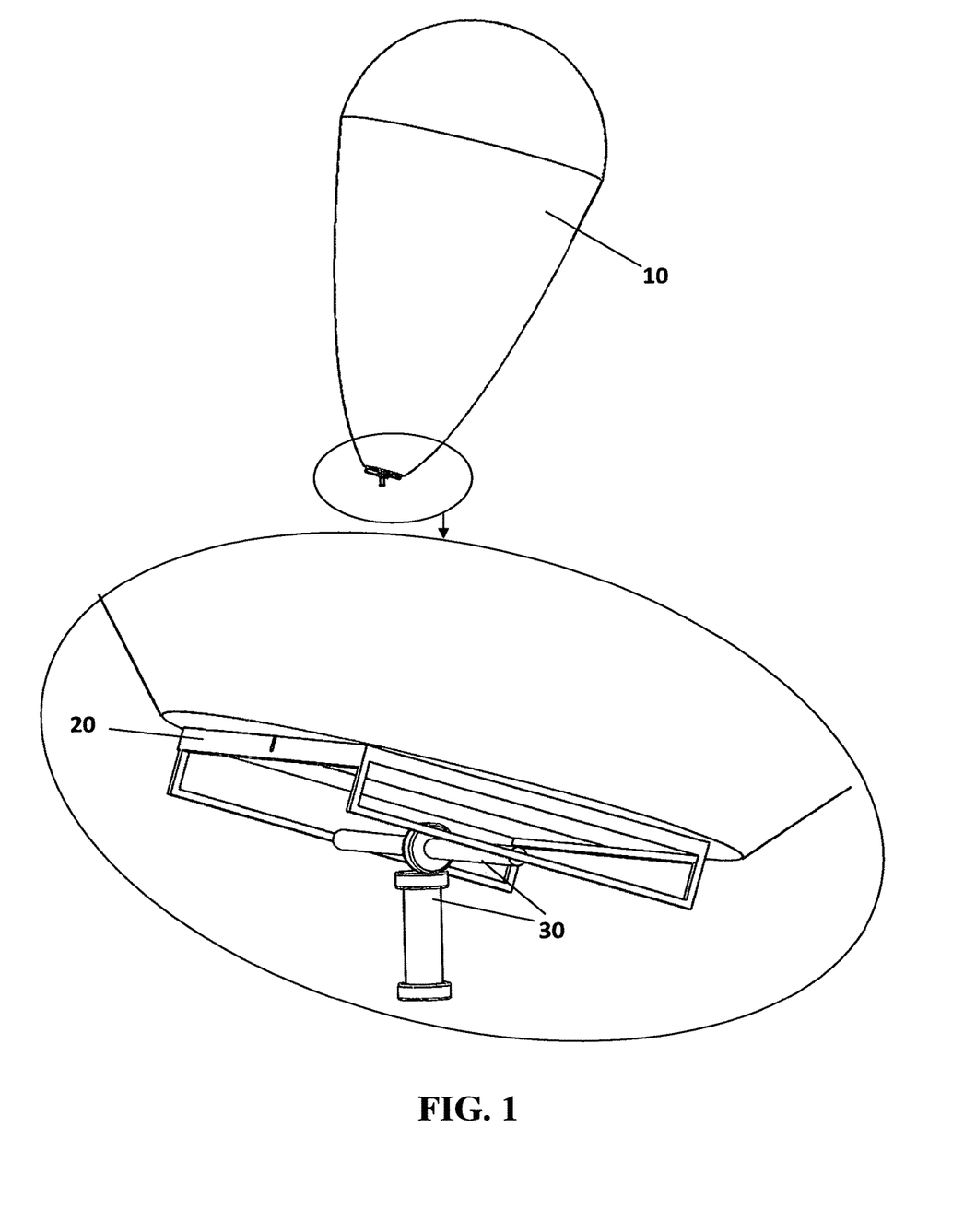
FIG. 1 is the overview of the INISC concentrator based concentrating hybrid solar thermal and photovoltaic system. The system comprises an INISC concentrator, a hybrid solar thermal and photovoltaic receiver, and a solar tracker.

Referring to FIG. 1, the INISC 10 concentrates the incident light onto the receiver 20, which is assembled with the hybrid solar thermal and photovoltaic panels, and the entire system is installed on the 2 axis solar tracker 30.

Figure 2:
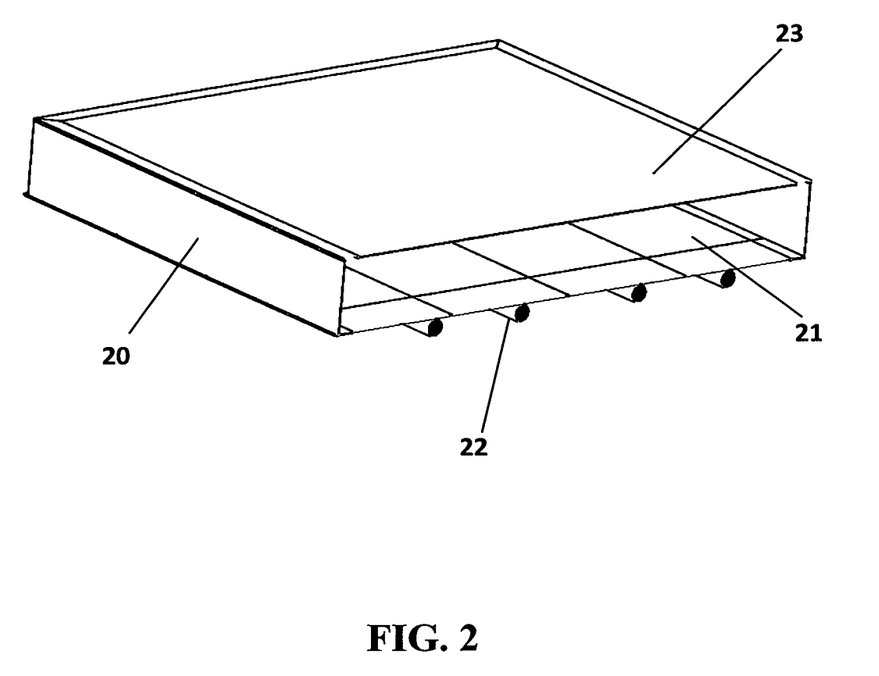
FIG. 2 is the cross section view of the hybrid solar thermal and photovoltaic panel used to construct the hybrid receiver for the INISC based concentrating thermal energy and electricity cogeneration system. Wherein, the photovoltaic cells are laminated on the fin-pipe plate coated with a heat-conductive and insulation coating to form the core part of the panel.

Referring to FIG. 2, the core part of the hybrid solar thermal and photovoltaic panel is formed by laminating the photovoltaic cells 21 onto the metal plate with the circulation pipes 22. When in operation, the concentrated sunlight penetrates through the transparent cover 23 and reaches to the photovoltaic cells, where it is absorbed and converted into electricity and heat. The electricity will be stored in a battery storage, and the heat will be extracted out by fluid circulation through the circulation pipes 22.

Figure 3:
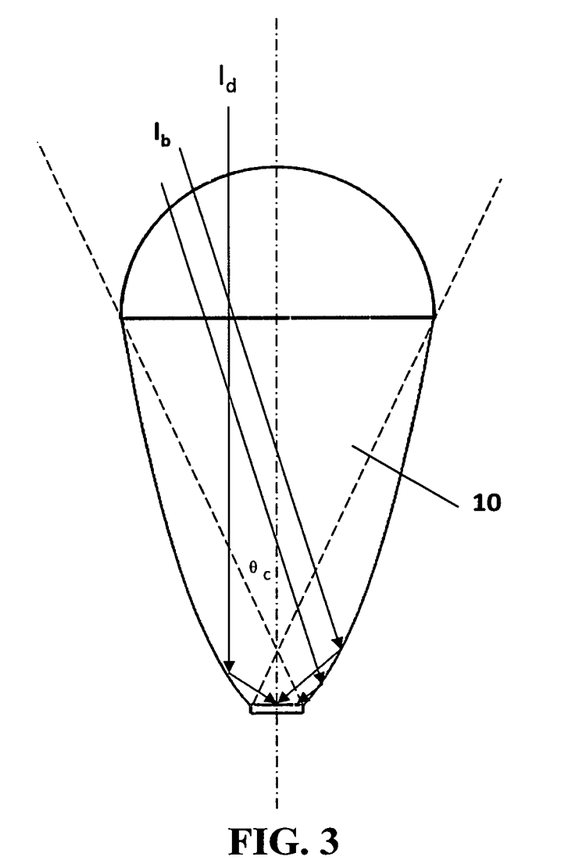
FIG. 3 is the illustration of the work principle of the INISC. The incident light no matter the diffuse light $I_d$ or the beam light $I_b$, as long as their incident angles fall in the half-acceptance angle $\theta_C$, will be concentrated onto receiver at the bottom of the INISC.

Referring to FIG. 3, the INISC 10 is formed by sealing a top transparent dome and bottom reflective Compound Parabolic Concentrator (CPC) together, and the central lines of the 2 parabola used to construct the CPC form the half-acceptance angles $\theta_C$ with the central line of the INISC. The incident beam light $I_b$ and diffuse light $I_d$ form the incident angles with the central line of the INISC 10. As long as the incident angles are smaller than the $\theta_C$, all incident lights no matter beam light or diffuse light will be concentrated to the bottom receiver.

Figure 4:
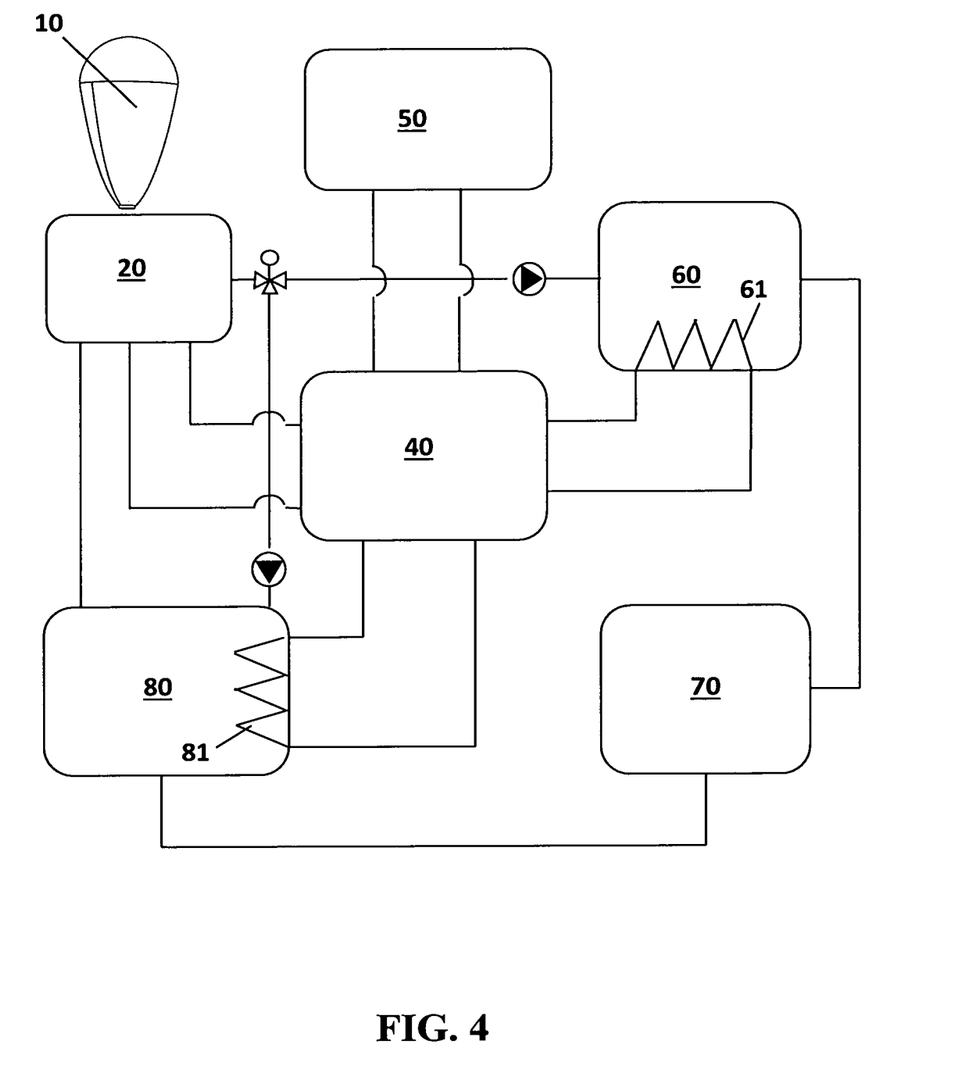
FIG. 4 is the configuration of the entire water desalination system powered by the INISC based concentrating hybrid solar thermal and photovoltaic system. The thermal energy cogenerated by the concentrating hybrid system is firstly used to preheat the water, and then the electric energy cogenerated by the concentrating hybrid system is used to raise the temperature of the preheated water for thermal power generation, an extra conventional photovoltaic system is integrated into the system to enhance the hybrid system, finally the steam used for thermal power generation is condensed to produce the fresh water.

Referring to FIG. 4, the entire system comprises 6 subsystems: (1) INISC based concentrating hybrid solar thermal and photovoltaic system, which consists the INISC 10, hybrid solar thermal and photovoltaic receiver 20, solar tracker 30; (2) battery storage 40, which is used to balance the intermittence of solar radiation; (3) conventional photovoltaic array 50, which is used to enhance the photovoltaic part of the concentrating hybrid solar thermal and photovoltaic system; (4) Thermal storage 60, which is used to store the thermal energy cogenerated by the concentrating hybrid solar thermal and photovoltaic system and raise the temperature of the stored heat through the electric heater 61; (5) thermal power generation system 70, which is used to regenerate power from the stored heat; (6) steam condensation system 80, which condenses the residue steam into fresh water after the thermal power generation process with the assistance of electric heater 81 for multiple effect distillation. When in operation, the solar radiation that incident on the INISC 10 is concentrated on the hybrid receiver 20 and converted into the thermal energy and electric power simultaneously. The thermal energy is transferred to the thermal storage tank 60, where its temperature is raised up through the electric heater 61. The electric power is stored into the battery storage 40, and then supplied to electric heater 61 to raise temperature of the stored heat. An extra photovoltaic system 50 is added to generate extra power and store it in the battery storage 40 to compensate the photovoltaic part of the concentrating hybrid solar thermal and photovoltaic system. The thermal energy stored in the thermal storage 60 and heated by the electric heater 61 is taken by the thermal power generation system 70 to regenerate power, and then the residue thermal energy is used to generate fresh water in the condenser 80 with assistance of electric heater 81 to enhance fresh water production.

Figure 5:
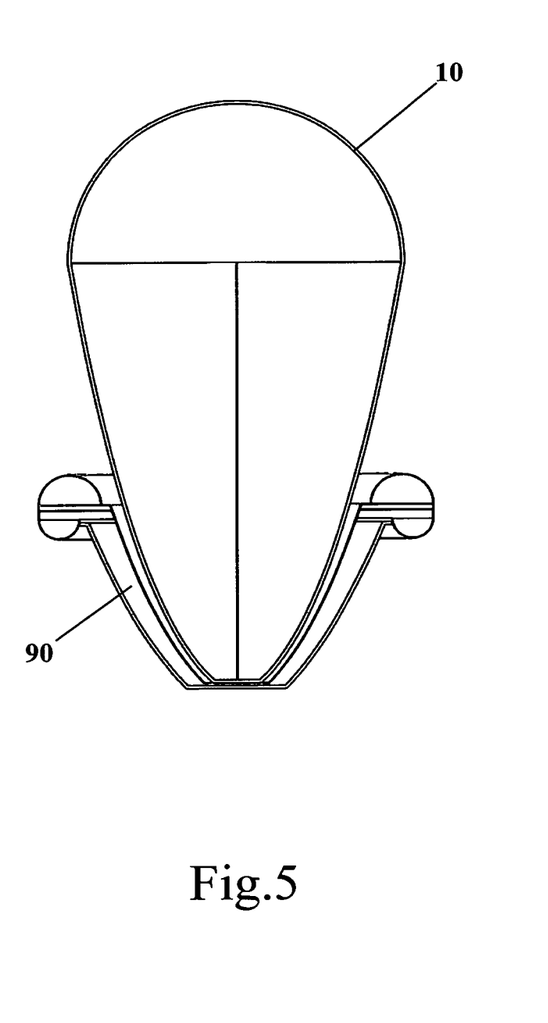
FIG. 5 is the cross section view of an INISC based concentrating solar thermal system. Wherein, the INISC directly concentrates the sunlight into the water contained in the receiver.

Referring to the FIG. 5, in order to enhance heating sea water directly, as another embodiment of the present invention, the INISC 10 directly concentrates the sunlight into the sea water contained in the receiver 90.

Figure 6:
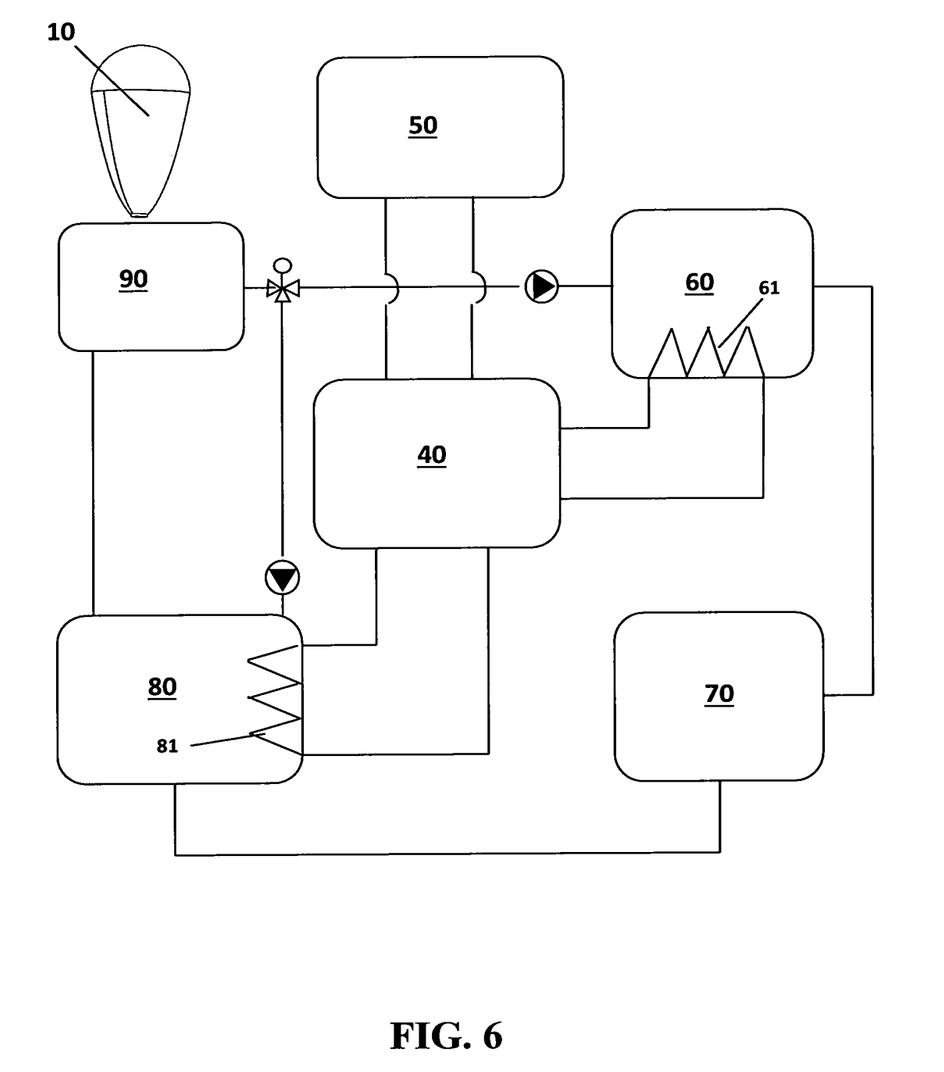
FIG. 6 is the configuration of another embodiment of the water desalination system powered by the INISC based concentrating thermal system and a conventional photovoltaic system. In this system, the INISC is used directly to preheat the water, and a conventional photovoltaic system is used to raise the temperature of the preheated water for thermal power generation, finally the steam after the thermal power generation is condensed into fresh water.

Referring to FIG. 6, the other embodiment system comprises 6 subsystems: (1) INISC based concentrating solar thermal system, which consists the INISC 10, receiver 90 containing the water for desalination; (2) battery storage 40, which is used to balance the intermittence of solar radiation; (3) conventional photovoltaic array 50, which is used to heat the preheated water; (4) Thermal storage 60, which is used to store the thermal energy generated by the concentrating solar thermal system and raise the temperature of the stored heat through the electric heater 61; (5) thermal power generation system 70, which is used to regenerate power from the stored heat; (6) steam condensation system 80, which condenses the residue steam into fresh water after the thermal power generation process with the assistance of electric heater 81 for multiple effect distillation. When in operation, the solar radiation that incident on the INISC 10 is concentrated on the receiver 90 and thereafter converted into the thermal energy. The thermal energy is transferred to the thermal storage tank 60, where its temperature is raised up through the electric heater 61. An extra photovoltaic system 50 is added to generate extra power and store it in the battery storage 40 to supply power to the electric heater 61. The thermal energy stored in the thermal storage 60 and heated by the electric heater 61 is taken by the thermal power generation system 70 to regenerate power, and then the residue thermal energy is used to generate fresh water in the condenser 80 with assistance of electric heater 81 to enhance fresh water production.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

I claim:
1. An inflatable non-imaging solar concentrator based concentrating hybrid solar thermal and photovoltaic system powered water desalination system, comprising:
  a. an inflatable non-imaging solar concentrator based concentrating hybrid solar thermal and photovoltaic subsystem comprising: an inflatable non-imaging solar concentrator; a thermal energy and electric power cogeneration receiver assembled with the hybrid solar thermal and photovoltaic panels; and a two axis tracker; said inflatable non-imaging solar concentrator based concentrating hybrid solar thermal and photovoltaic subsystem concentrates sunlight and cogenerates heat and electricity;
  b. a battery storage subsystem, said battery storage subsystem store the electricity generated from said inflatable non-imaging solar concentrator based concentrating hybrid solar thermal and photovoltaic subsystem;
  c. a photovoltaic panel array subsystem, said photovoltaic panel array subsystem charge said battery storage subsystem to compensate said inflatable non-imaging solar concentrator based concentrating hybrid solar thermal and photovoltaic subsystem;
  d. a thermal storage subsystem comprising: a thermal storage tank; and an electric heater; said thermal storage tank store the thermal energy generated by said inflatable non-imaging solar concentrator based concentrating hybrid solar thermal and photovoltaic subsystem and said electric heater heat the stored thermal energy to a pre-set high temperature;
  e. a thermal power generation subsystem, said thermal power generation subsystem takes the heat stored in said thermal storage subsystem to regenerate power;
  f. a water distillation subsystem comprising: a water distiller; and an electric heater; said water distiller takes the residue thermal energy from said thermal power generation subsystem to desalinize the salty water for production of fresh water with the assistance of said electric heater;

wherein, said inflatable non-imaging solar concentrator based concentrating hybrid solar thermal and photovoltaic subsystem is coupled to said battery storage subsystem with at least one electric cable and one controller, and connected to said thermal storage subsystem with at least one conduit and one pump; said photovoltaic panel array subsystem is coupled to said battery storage subsystem with at least one electric cable; said battery storage subsystem is connected to said electric heater in said thermal storage subsystem; said thermal storage subsystem is connected to said thermal power generation subsystem with at least one conduit and one pump; said thermal power generation subsystem is connected to said water distillation subsystem with at least one conduit and one pump; said water distillation subsystem is coupled back to said inflatable non-imaging solar concentrator based concentrating hybrid solar thermal and photovoltaic subsystem with at least one conduit and one pump; said battery storage subsystem is connected to said electric heater in said water distillation subsystem with at least one electric cable.

2. The inflatable non-imaging solar concentrator based concentrating hybrid solar thermal and photovoltaic subsystem of claim 1, wherein said inflatable non-imaging solar concentrator is mounted on said thermal energy and electric power cogeneration receiver assembled with the hybrid solar thermal and photovoltaic panels, both said inflatable non-imaging solar concentrator and said thermal energy and electric power cogeneration receiver assembled with the hybrid solar thermal and photovoltaic panels are mounted on said two axis tracker.

3. The inflatable non-imaging solar concentrator based concentrating hybrid solar thermal and photovoltaic system powered water desalination system of claim 1, wherein the thermal power generation subsystem is connected to the water distillation subsystem, so that the residue thermal energy of the thermal power generation subsystem will be utilized to generate fresh water.

* * * * *